United States Patent
Bereza et al.

(10) Patent No.: US 7,304,498 B2
(45) Date of Patent: Dec. 4, 2007

(54) CLOCK CIRCUITRY FOR PROGRAMMABLE LOGIC DEVICES

(75) Inventors: William W Bereza, Nepean (CA); Shoujun Wang, Kanata (CA); Rakesh H Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 63 days.

(21) Appl. No.: 11/432,419

(22) Filed: May 10, 2006

(65) Prior Publication Data

US 2007/0019766 A1 Jan. 25, 2007

Related U.S. Application Data

(60) Provisional application No. 60/701,205, filed on Jul. 20, 2005.

(51) Int. Cl.
*H01L 25/00* (2006.01)

(52) U.S. Cl. ............... 326/38; 326/41; 326/47; 326/101

(58) Field of Classification Search ............ 326/37–41, 326/47, 101
See application file for complete search history.

(56) References Cited

U.S. PATENT DOCUMENTS

| | | |
|---|---|---|
| 4,486,739 A | 12/1984 | Franaszek et al. |
| 5,319,360 A | 6/1994 | Schrodi et al. |
| 6,549,045 B1 * | 4/2003 | Wang et al. ............ 327/115 |
| 2005/0200390 A1 | 9/2005 | Starr et al. |

FOREIGN PATENT DOCUMENTS

WO   WO 2006/017460 A3   2/2006

\* cited by examiner

*Primary Examiner*—Minsun Oh Harvey
*Assistant Examiner*—Thienvu Tran
(74) *Attorney, Agent, or Firm*—Ropes & Gray LLP; Robert R. Jackson

(57) ABSTRACT

Data transmitter circuitry on a programmable logic device ("PLD") includes a plurality of channels of serializer circuitry, and a plurality of clock multiplier units ("CMUs"), each of which is associated with a respective subplurality of the serializer channels. Each CMU includes multiple reference clock signal sources, multiple phase-locked loop ("PLL") circuits, and circuitry for allowing any PLL to get its reference input from any of the reference sources. Raw and centrally processed clock signals produced by each CMU are distributed to the serializer channels associated with that CMU and, at least in the case of the centrally processed signals, to the serializer channels associated with another CMU. The signal that controls release of parallel data to each serializer channel can be an output signal of that channel, or it can be an output signal of any CMU from which that channel can get a clock signal.

21 Claims, 8 Drawing Sheets

US 7,304,498 B2

CLOCK CIRCUITRY FOR PROGRAMMABLE LOGIC DEVICES

This application claims the benefit of U.S. provisional patent application No. 60/701,205, filed Jul. 20, 2005, which is hereby incorporated by reference herein in its entirety.

BACKGROUND OF THE INVENTION

This invention relates to programmable logic devices ("PLDs"), and more particularly to clock circuitry for use on PLDs. An important purpose of this clock circuitry is to help the PLD support various high-speed serial data signaling schemes or protocols.

PLDs are intended as relatively general-purpose devices. A PLD can be made more useful by increasing the number of functions it can perform. In the area of data communication, there is increasing interest in high-speed serial data communication. This communication may take any of a large number of forms. For example, such communication may be via one channel or via several channels that can operate relatively independently of one another. Alternatively or in addition, such communication may be via several channels that must be highly synchronized with one another. The number of channels employed may vary considerably. For example, four synchronized channels may be needed, or eight synchronized channels may be needed. Very high serial data rates may be needed (e.g., anywhere from 622 Mbps (megabits per second) to 6.5 Gbps (gigabits per second)). Elsewhere on the PLD that data is typically handled in parallel form, which may have any of several different formats (e.g., 8-bit bytes, 10-bit bytes, two parallel 8-bit bytes, or two parallel 10-bit bytes), and the transmitter circuitry needs to be able to serialize data having any of those parallel formats.

The proliferation of serial data communication protocols that it would be desirable for a PLD to be able to support calls for continued improvement of PLD serial data transmitter circuitry. This is particularly true with regard to the clock circuitry that is provided on a PLD to support various serial data transmission options. Channels that are operating independently or relatively independently of one another may need independent or relatively independent clock signals, and those signals may need to have a number of different frequencies and/or other different characteristics. On the other hand, communication protocols that require a large number of synchronized channels (e.g., up to eight channels) need the support of clock signals that can be generated in a highly centralized manner and then efficiently distributed to all of the channels that will use those clock signals.

SUMMARY OF THE INVENTION

A PLD in accordance with this invention includes a plurality of channels of serializer circuitry, and a plurality of clock multiplier units (CMUs), each of which is associated with a respective subplurality of the serializer channels. Each CMU may include a plurality of reference clock sources, a plurality of phase-locked loop ("PLL") circuits, and circuitry for allowing each PLL to get its reference input from any of the reference clock sources. At least one PLL in each CMU produces a so-called raw clock signal that is distributed to all of the serializer channels associated with that CMU. The output of another PLL in each CMU is applied to central clock generation and buffering ("CGB") circuitry of that CMU to produce a centrally processed clock signal or family of clock signals. The centrally processed clock signal(s) of each CMU is (are) distributed to all of the serializer channels associated with that CMU, and also to all of the serializer channels associated with another CMU. The circuitry that releases parallel data to each of the serializer channels (e.g., physical coding sublayer ("PCS") channel circuitry associated with each of the serializer channels) is controlled to release parallel data to the serializer channel by a so-called PCLK signal. Each PCS channel can get its PCLK signal from an output signal of the associated serializer channel or a signal output by any CMU from which that serializer channel can get a centrally processed clock signal.

Further features of the invention, its nature and various advantages, will be more apparent from the accompanying drawings and the following detailed description.

DETAILED DESCRIPTION

Figure 1:
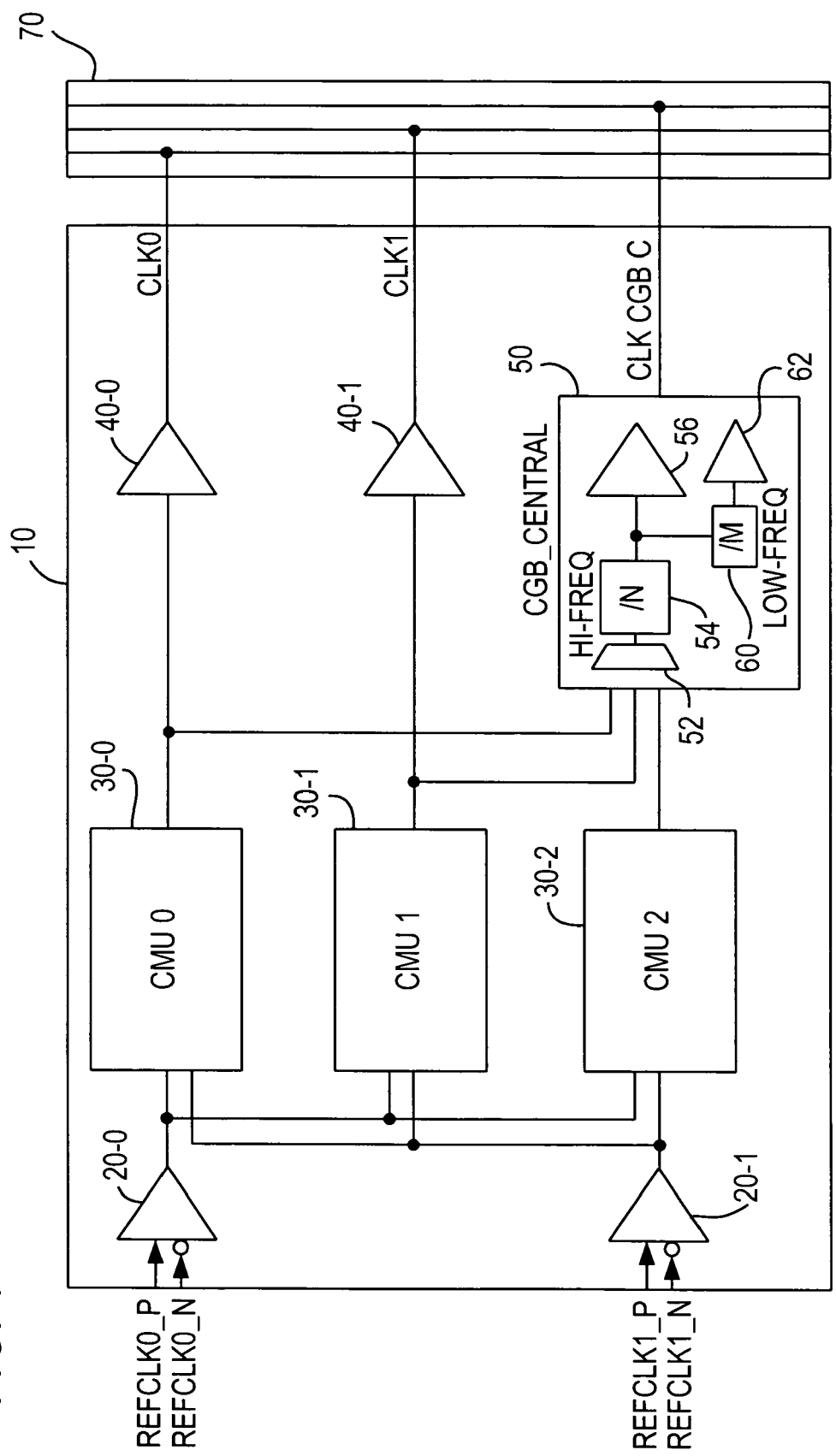
FIG. 1 is a simplified schematic block diagram of an illustrative embodiment of circuitry constructed in accordance with the invention.

An illustrative embodiment of a clock multiplier unit ("CMU") macro 10 (including some associated clocking architecture) is shown in FIG. 1. This circuitry comprises the components described in the following sentences. Reference clock signal receivers 20-0 and 20-1 receive and condition incoming reference clock signals and pass them to CMUs 30-0, 30-1, and 30-2. (Because of the multiple CMUs 30 and references 20 available, the reference clock path architecture may be more complicated than is shown in FIG. 1. This aspect of the circuitry is covered in greater detail later.) Each of CMUs 30-0 through 30-2 is basically phase-locked loop ("PLL") circuitry that is responsible for the generation of new clocks based on available reference clocks allowed into macro 10. So-called raw clock output drivers 40-0 and 40-1 drive the clock outputs of CMUs 30-0 and 30-1, respectively, onto associated conductors in high-speed bus circuitry 70. Centralized clock generation and buffering ("CGB") circuitry 50 can operate on the output signals of any selectable one of CMUs 30 to produce signals that are more extensively processed than the raw signals from drivers 40. The output signals of central CGB 50 are also applied to associated conductors in high-speed bus 70.

The circuitry shown in FIG. 1 is constructed to provide enhanced flexibility as compared to previously known circuitry. Among the features of circuitry of the type shown in FIG. 1 are those described in the next several sentences. The FIG. 1 circuitry includes several instantiations of CMU circuitry 30. Each CMU 30 is assignable to either of the two reference clock receivers 20. In the particular example shown in FIG. 1 there are three CMUs 30 in one CMU macro 10. Several of the CMUs 30 produce raw clocks that can be applied to several channels of high-speed serial interface ("HSSI") circuitry (not shown in FIG. 1, but shown in several later FIGS.). In addition, several other clocking mode configurations are possible through centralized CGB circuit 50. Within the HSSI channels, further processing of the raw clock frequencies extend the available transmit frequency plan. This can be done using clock division circuitry in each channel as will be shown and described later in this specification.

In the particular example shown in FIG. 1, the greatest reference-clock-to-CMU ratio is 2:3. However, this ratio is configurable to 1:1, 1:2, 1:3, 2:3, and sub-rate configurations. (A sub-rate configuration results from using frequency divider 54 to divide an applied clock signal frequency by a factor like 2 or 4, or by using similar frequency divider circuitry in an HSSI channel to similarly divide the frequency of a clock signal applied to that channel.) Note that when configuring the circuitry as one CMU 30 per "quad", one can generally power down unused CMUs. (The term quad refers to an architecture in which each CMU macro 10 is nominally associated with four HSSI channels.) Among the possible configurations (i.e., selectable uses) of the FIG. 1 circuitry is two independent CMUs 30 to two reference clocks. This may be characterized as a 2:2 configuration (which is like two instances of a 1:1 configuration). Other possible configurations include having a single reference clock service HSSI channels individually, a quad of channels collectively, or two quads of channels collectively.

Another feature of the FIG. 1 circuitry is that integer-N sub-rate clocking is possible, both globally using divider 54 in FIG. 1 or locally using similar dividers in the various HSSI channels. Independent rate operation (i.e., each HSSI channel having its own data rate) is facilitated by this. (As a matter of terminology, independent operation of HSSI channels may be referred to as "X1" mode; operation together of up to four HSSI channels in a quad may be referred to as "X4" mode; and operation together of up to eight HSSI channels in two quads may be referred to as "X8" mode.)

The circuitry shown in FIG. 1 includes high-speed bus 70 that is dedicated to transmitting clock signals from CMU macro 10 to associated HSSI channels. (Low-speed clock reference paths to the left of CMUs 30 in FIG. 1 are shown greatly simplified in this FIG. to avoid undue complication of this initial drawing. But this low-speed circuitry is shown in more detail later in this specification.)

Examples of applications of the invention are to communication protocols such as PCI_Express (X1, X4, and X8 modes of clocking), XAUI (X4), CEI (X1), Sonet backplanes, and other similar applications. Note that this architecture is not limited to any particular standard or application.

Figure 2:
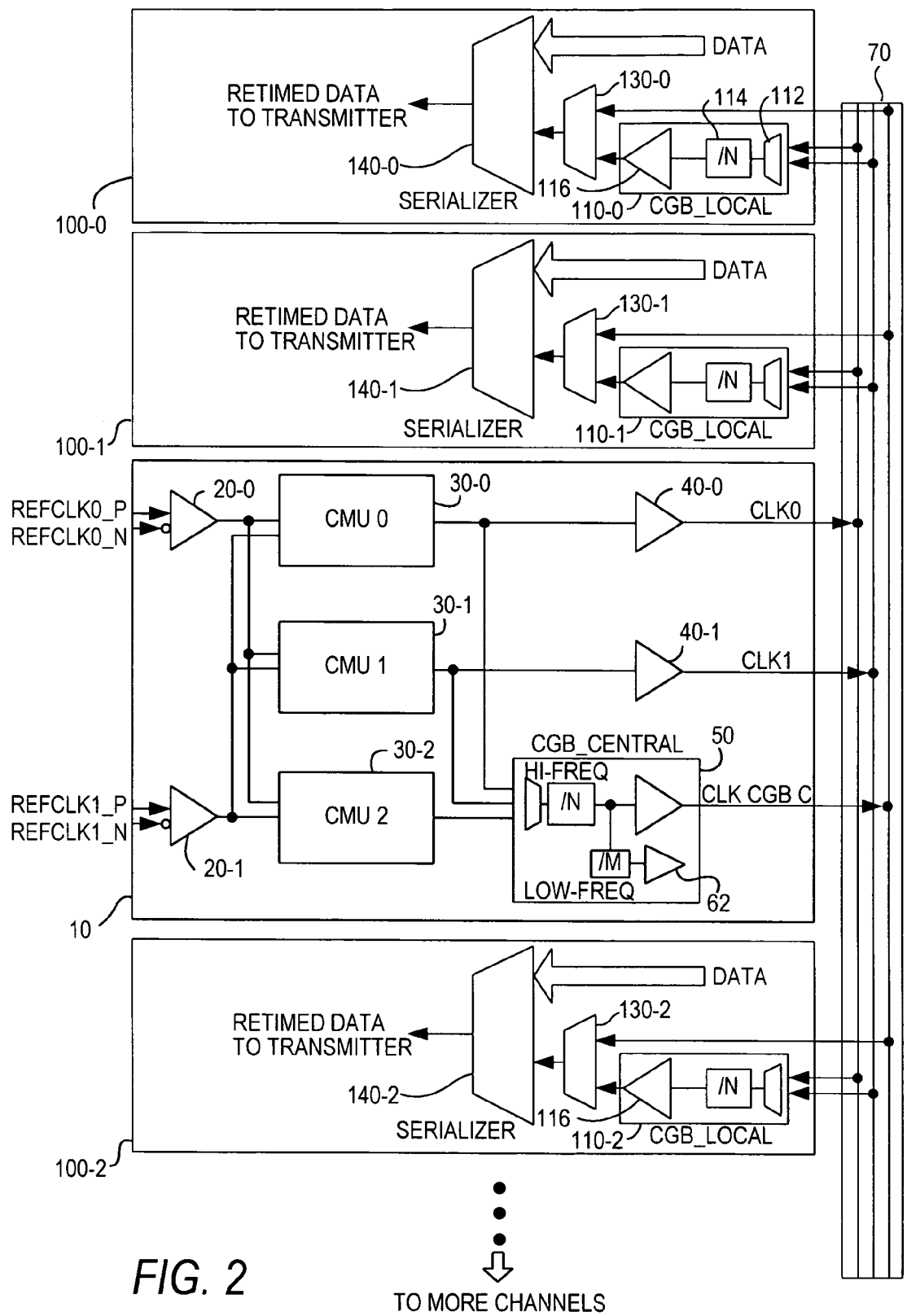
FIG. 2 is a simplified schematic block diagram of an illustrative embodiment of additional circuitry constructed in accordance with the invention.

One reason it is desirable to be able to generate complex clocks (e.g., as in FIG. 1 and subsequent aspects of this disclosure) is to facilitate the serialization of data from parallel to serial data streams. Such parallel-to-serial conversion can be done in the transmitter portion of each HSSI channel. Referring to FIG. 2, the flexibility to create serialization clocks discussed earlier becomes apparent. For example, FIG. 2 shows how high-speed bus 70 connects HSSI channels 100 to CMU macro 10. Also seen is the global vs. local clock generation from the CGB_Central (50) and CGB_Local (110) units, respectively. These units provide the specialized clocks that are required by the serializer 140 in each channel 100. Each serializer 140 requires high-frequency signals that are related to the bit rate of the serial data to be transmitted, and low-frequency signals that are related to the byte rate of the parallel data received (ultimately from the PLD) for transmission. The parallel data may be presented in any of a number of different widths (e.g., individual 8-bit bytes, individual 10-bit bytes, two 8-bit bytes, or two 10-bit bytes). Thus each serializer 140 may need to first serialize a pair of 8-bit bytes or a pair of 10-bit bytes. Then the serializer may need to serialize the eight or ten bits of each byte. As a general matter, circuit elements like 54 and 114 provide the high-frequency clocks for serialization (N being selectable from such values as 1, 2, 4, etc.), while circuit elements like 60 (and comparable circuitry associated with each of components 110) provide the low-frequency clocks for serialization (M being selectable from such values as 4 and 5 (for 8-bit bytes and 10-bit bytes, respectively). Each serializer 140 may also require a synchronization pulse signal. That signal can also be supplied either globally (circuitry 50) or locally (circuitries 110).

To demonstrate the flexibility of this architecture, consider a case in which central CGB unit 50 is used to globally distribute clocks required by serializers 140. (The multiplexer 130 in each channel 100 that will use these global signals is configured (programmed) to apply the global signals to the serializer 140 of that channel.) By globally creating these clocks, the serializers 140 are forced to operate at one frequency. This is also achievable in some prior art architectures. But a difference here is that raw CMU clocks are also transmitted, which offers considerable frequency plan flexibility. Moreover, the whole CMU macro 10 is a culmination of several CMUs 30 and several references 20, and the clock generation is not limited to global distribution. To reiterate, even though a singular CMU 30 is configured from a singular reference clock 20, it is possible for the same CMU to also drive raw clocks to any number of channels (via a driver 40), where it is received by a local CGB 110.

Figure 3:
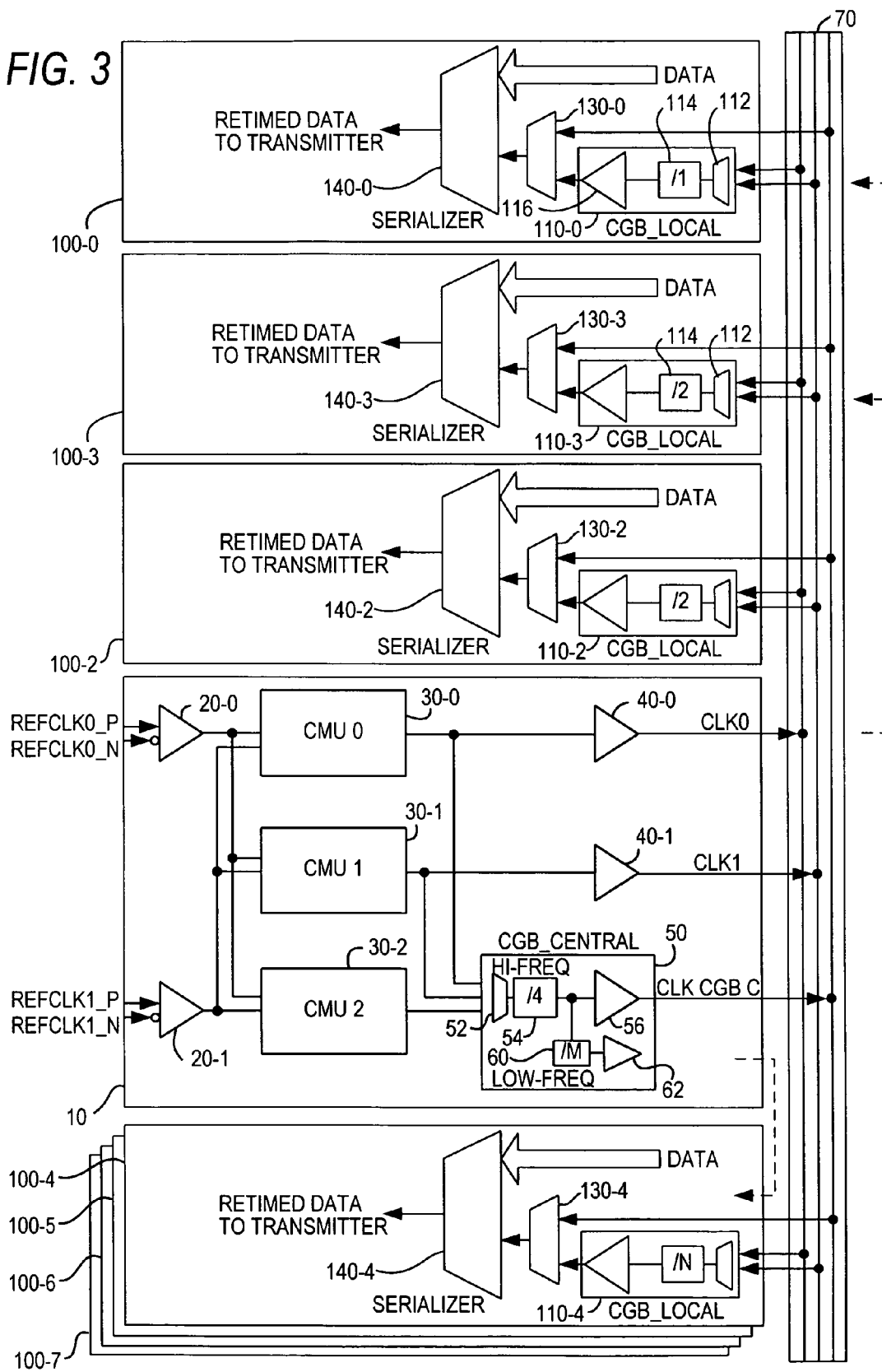
FIG. 3 is a simplified schematic block diagram of an illustrative embodiment of still more circuitry constructed in accordance with the invention, and showing a particular illustrative use or configuration of that circuitry.

An example of what is mentioned at the end of the last paragraph is shown in FIG. 3. In this example the following elements in CMU macro 10 are not used: 20-1, 30-1, 30-2, and 40-1. Multiplexer 52 is configured (programmed) to select the output signal of CMU 30-0 for use in circuitry 50. Circuitry 54 is configured (programmed) to divide the applied signal frequency by 4. Multiplexers 110 in channels 100-0, 100-2, and 100-3 are configured (programmed) to select the signal from driver 40-0 for use by the associated circuitry 110. Circuitry 114 in channel 100-0 is configured (programmed) to have N=1 (no frequency division in that channel). Circuitries 114 in channels 100-2 and 100-3 are configured (programmed) to have N=2 (frequency division by 2 in those channels). Circuitry 54 is configured (programmed) to have N=4. Multiplexers 130 in channels 100-0, 100-2, and 100-3 are configured (programmed) to pass signals from the associated circuitry 110. Multiplexers 130 in channels 100-4 through 100-7 are configured to pass signals from circuitry 50.

From the foregoing it will be apparent that it is possible to create from one CMU a high-frequency clock (e.g., at 2 GHz) to process high-rate data in channel 100-0, and at the same time to have two other channels 100-2 and 100-3 operate at a sub-rate of 1 GHz (local dividers 114 in channels 100-2 and 100-3 set to divide by 2). In parallel, 500 MHz clocks are distributed to four other channels (100-4 through 100-7) synchronously via the central CBG unit's divider 54, which is set to divide by 4 in this example.

By using both reference clock inputs 20 it is possible to have non-integer-related frequency plans. For example, CMU 30-0 and CMU 30-1 can be derived from completely independent reference clock inputs. The outputs of those CMUs can be routed separately to all associated channels. The multiplexer 112 in each channel can select either of these signal bundles for use in that channel, possibly with local frequency division by the component 114 in that channel.

It will be appreciated that the invention is not limited to having only two reference clocks 20 and three CMUs 30 per CMU macro 10, but that a CMU macro can have any plural members of reference clocks and CMUs in accordance with this aspect of the invention.

Figure 4:
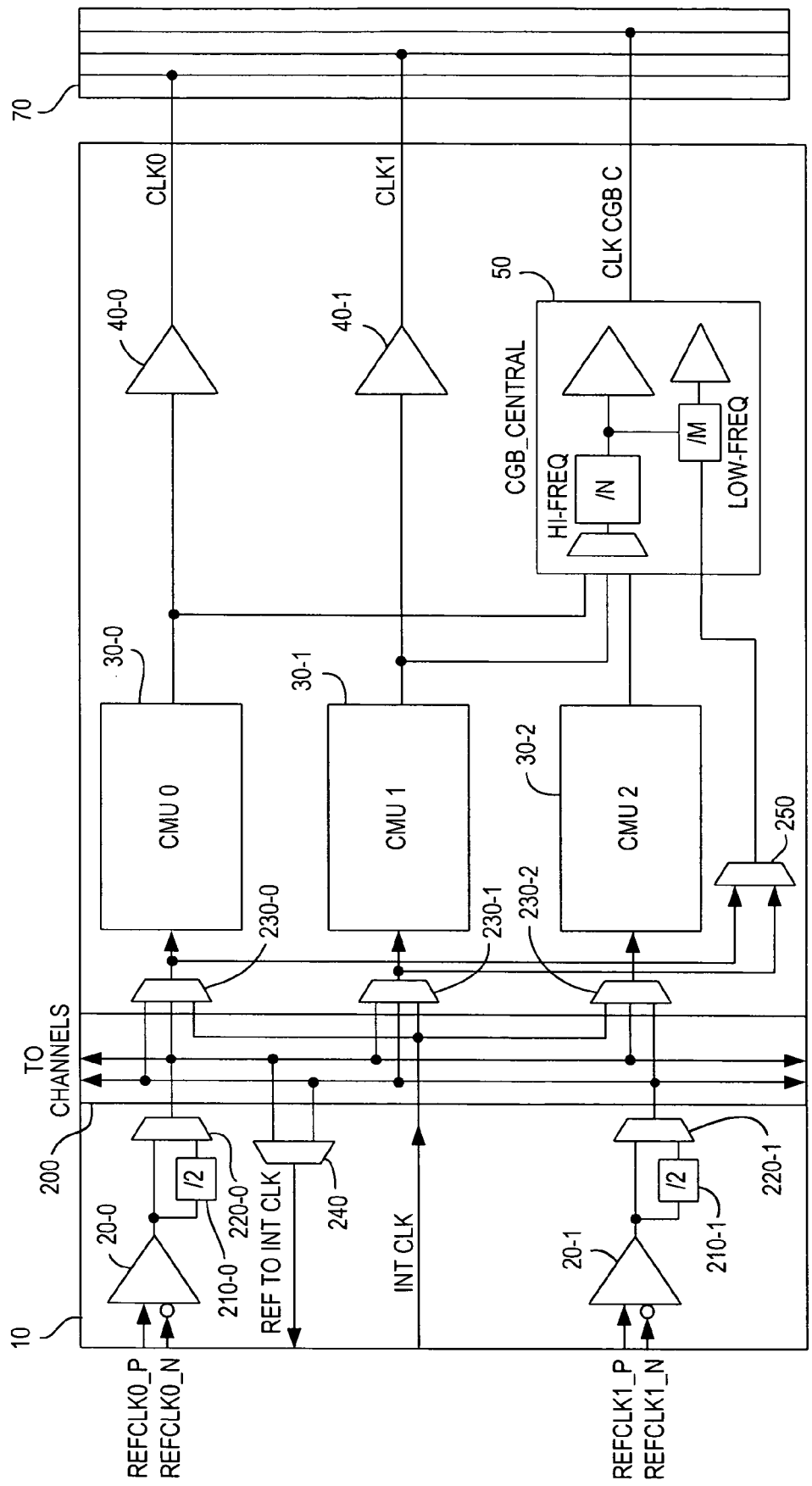
FIG. 4 is similar to FIG. 1, but shows an illustrative embodiment of certain aspects of what is shown in FIG. 1 in more detail in accordance with further possible aspects of the invention.

FIG. 4 shows an illustrative embodiment of multiplexing and signal path architecture that can be used to distribute reference clock signals via programmable settings. This circuitry includes low-speed bus 200, input frequency dividers 210-0 and 210-1, and multiplexers 220-0, 220-1, 230-0, 230-1, 230-2, 240, and 250. Low-speed bus 200 distributes reference clock signals from sources 20 and other internal clock sources ("int. clk") to CMU-feeding multiplexers 230, and also to other destinations such as clock and data recovery ("CDR") circuitry in the receiver portions of HSSI channels associated with CMU macro 10 ("to channels") and the int. clk inputs of one or more other CMU macros on the PLD ("Ref to int clk"). Further discussion of the additional details shown in FIG. 4 is provided in the next paragraph.

As has been mentioned, the connections "Ref to int clk" and "int. clk" provide and receive clock references to/from other CMU macros that exist on the PLD. Each CMU macro contains multiple reference multiplexing, since there are several CMUs in each macro and several reference sources for use by each CMU in each macro. These reference sources include references from other macros. Clocks taken after some intermediate muxing 220 can be used as training references for CDR circuitry that is located in the receive side of each channel. The multiplexers 220 to the left of the low-speed bus conductors 200 may be referred to as pre-LSbus muxes. Conductors 200 allow reference clock distribution to destinations outside CMU macro 10. Pre-LSbus muxes 220 pass clock references with optional frequency division and duty-cycle correction applied. This option is offered because division early on, prior to distribution, allows power saving, since this would otherwise need to be repeated for other circuits at the destination end of the low-speed bus 200. Post-LSbus muxes 230 are used to optionally allow internal clocks (e.g., from other quads) to be muxed into any of CMUs 30. These post-LSbus muxes 230 are strategically instantiated on either a per-reference or per-CMU basis. The actual implementation may include more conductors 200 and more options than are shown in FIG. 4. Finally, a bypass mux 250 is provided for extracting post-LSbus mux reference clocks as a test signal injection option.

The following points relate to CMU aspects of the invention. Multiple PLLs in a single macro 10 may be a noise transfer concern. This can be addressed via voltage regulation on each charge pump and each VCO to suppress noise injection (see, for example, commonly assigned, co-pending, Shumarayev et al. U.S. patent application Ser. No. 11/295,391, filed Dec. 5, 2005). Clock generation uses integer divider ratios (the parameter N in the FIGS.) to create the basic, highest common frequency. Dividers 54 and 114 in clock-generation circuitry (CGB_Central and CGB_Local) have the same effect as dividing the reference in front of the CMU PLL. The advantage of having both global (54) and local (114) dividers is that it facilitates having the highest common frequency on the high-speed bus 70. This can help to reduce the number of PLLs required when dealing with integer-N rates from one CMU to another. Another feature of the invention is that CMU inputs can have duty-cycle corrected reference signals as a result of use of dividers 210 (which can include or be augmented by duty correction circuitry). It is not necessary for all CMUs 30 used in a CMU macro 10 to have the same structure. Rather, they can vary in type and implementation if desired. Reference clock division (using circuit elements like 210 and 220 in FIG. 4) can include ratios other than /1 and /2 if desired. Within each CMU 30 feedback division (see FIG. 5; feedback division by M) can be selected (e.g., programmably) from /1, /4, /5, /8, /10, /16, /20, and /25, but other ratios can also be provided if desired. Each CMU 30 can include voltage controlled oscillator ("VCO") base-2 frequency range extension via a divider employing any (programmably) selectable one of /1, /2, and /4 (see again FIG. 5; division by L), but other ratios can also be provided if desired. CGB_Central and CGB_Local ratios (in elements 54 and 114) are programmably selectable from /1, /2, and /4. But, again, other ratios can also be provided if desired.

The following discussion relates to clock generation and buffering aspects of the invention.

Figure 7:
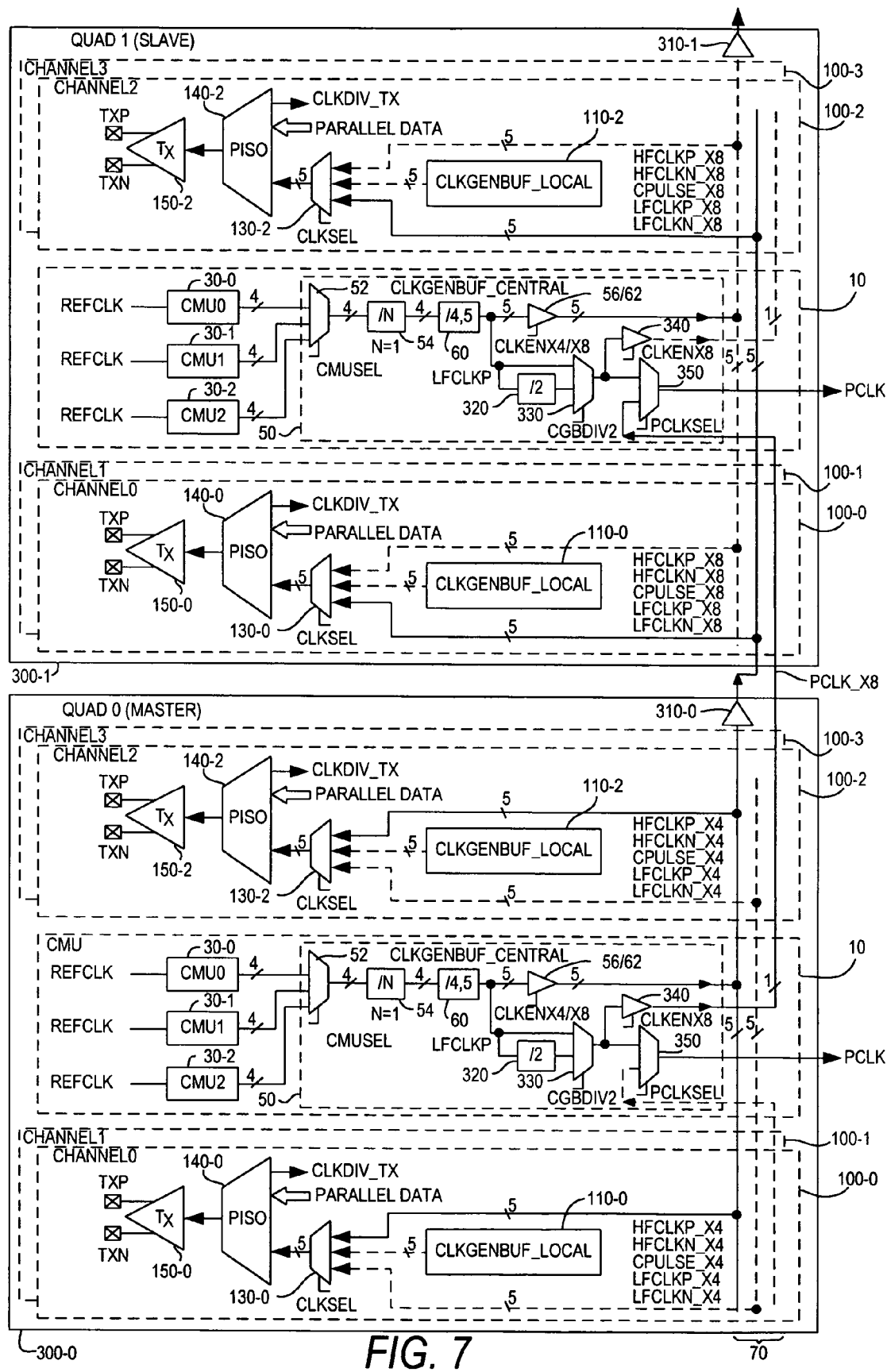
FIG. 7 is again similar to FIG. 6, for yet another illustrative use or configuration of the circuitry in accordance with the invention.

Either local (110) or centralized (50) clock generation and buffering can be performed. This and other features allow several clocking modes that will be described in greater detail below. Note that in X8 mode (shown in great detail in FIG. 7, and further described later in this specification) a distinct feature of CGB_Central allows clocks that originate from another CMU macro 10 to be repeated. In other words, clocks enter a second CGB_Central 50 and get re-buffered out via dividers inside the circuitry. Again, this is shown in FIG. 7 and further described later.

There are three fundamental modes: X1 mode (signals are sent out via a driver 40 and received by local CGB circuitry 110), X4 mode, and X8 mode.

Figure 5:
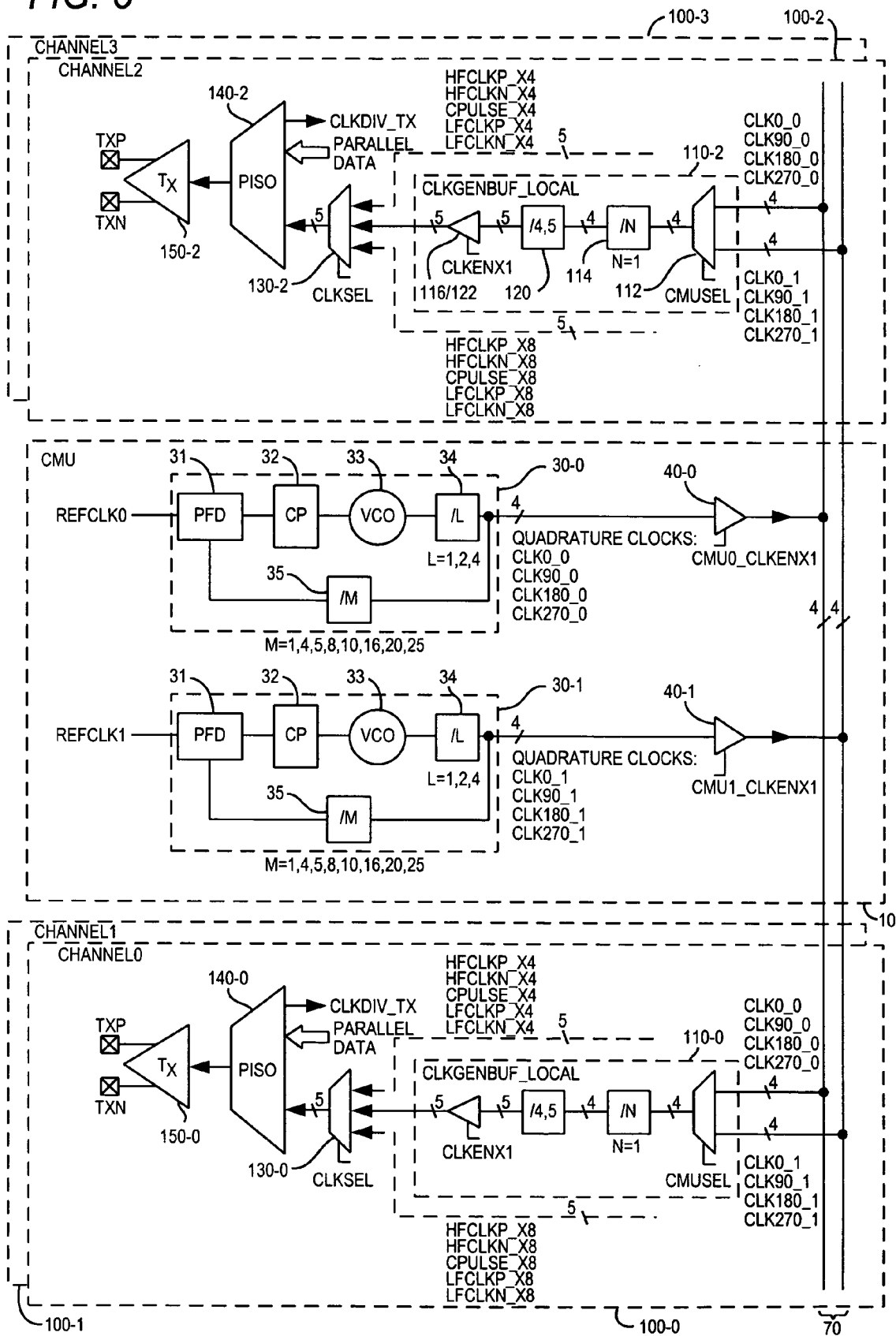
FIG. 5 is similar to FIG. 2, but shows certain aspects in more detail, and also shows a particular use or configuration of the depicted circuitry, all in accordance with further possible aspects of the invention.

X1 mode is illustrated in more detail by FIG. 5. The outputs from drivers 40 are buffered raw quadrature clocks called CLK0, CLK90, CLK180, and CLK270. A low-frequency clock called PCLK (or in this case CLKDIV_TX) is derived using the CGB_Local 110 circuitry. PCLK is used to allow parallel data that exists in the physical coding sublayer ("PCS") to be synchronously sent to the serializer (see FIG. 8 and the discussion of that FIG. later in this specification). PCLK is the signal that clocks this data out to the serializer on a PCLK-per-channel basis in X1 mode. These individual PCLK signals are called CLKDIV_TX as noted above.

Note that FIG. 5 also shows an illustrative construction of CMUs 30. In particular, FIG. 5 shows that a CMU may include phase-frequency detector 31, charge pump 32, VCO 33, divide by L circuitry 34, and divide by M circuitry 35. L can be programmably selected from any of values 1, 2, and 4 (but other values can also be made options if desired). M can be programmably selected from any of values 1, 4, 5, 8, 10, 16, 20, and 25 (but, again, other values can also be made options if desired).

FIG. 5 also shows more details of local CGB circuitry 110. In particular, FIG. 5 shows that circuitry 110 includes both divide by N circuitry 114 and divide by M circuitry 120 (comparable to central component 60 in FIG. 1).

Figure 6:
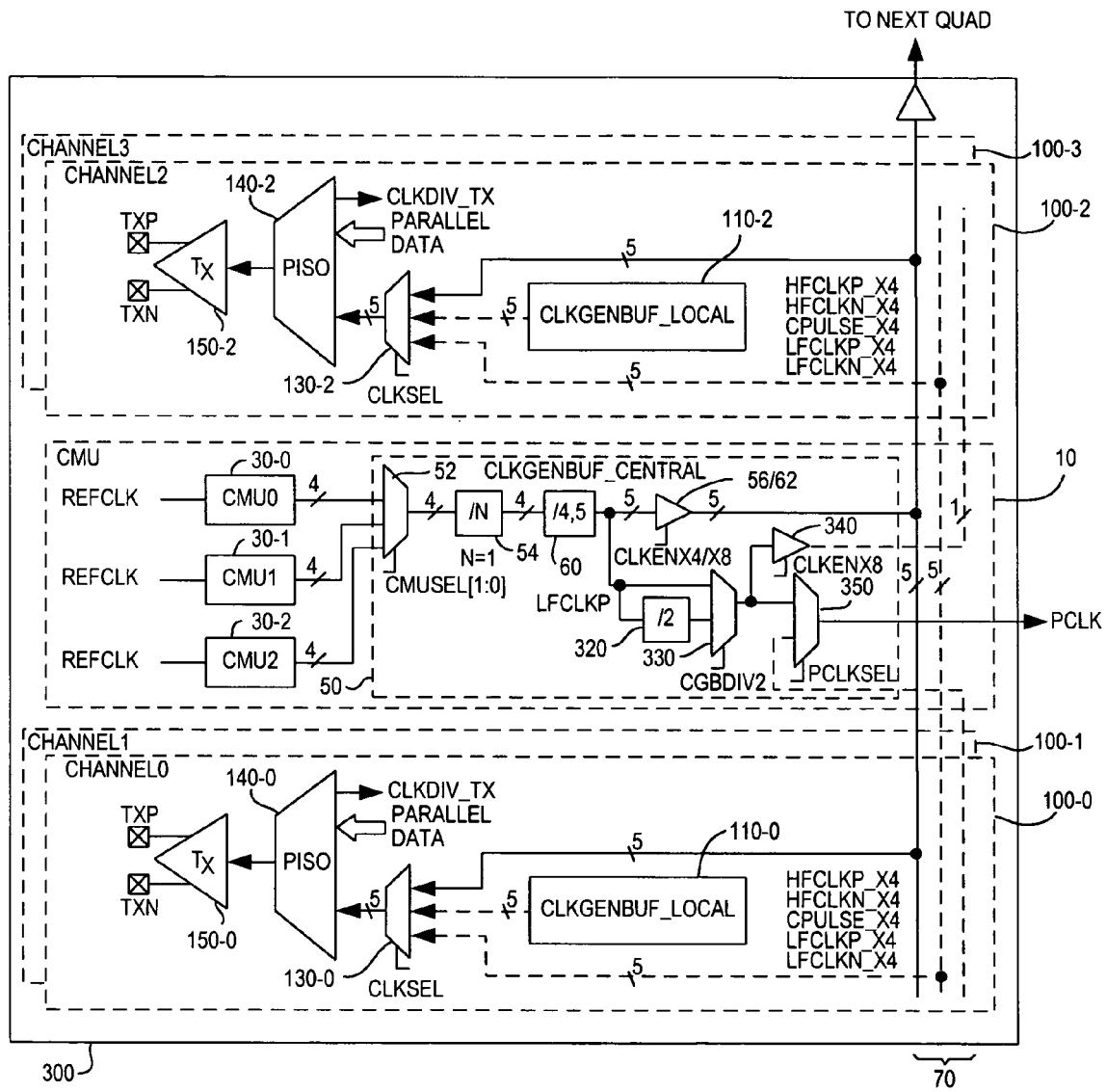
FIG. 6 is generally like FIG. 5, but shows another illustrative use or configuration of the circuitry in accordance with the invention.

X4 mode is illustrated in more detail by FIG. 6. This mode employs one CMU 30 per quad. It relies on the CGB_Central 50 to send all the clocks necessary to perform parallel-to-serial conversion. The outputs of CGB_Central 50 are high-frequency, low-frequency, and synchronization pulse signals called HFCLK, LFCLK, and CPULSE. In this mode PCLK is derived from LFCLK and is used as a common clock to the PCS for four channels 100 to release the parallel data to the serializers. This is generally similar to X1 mode, except data is released to all four channels at the same time (i.e., relatively skew-free). CGB_Central 50 may or may not be powered down, depending on the configuration (e.g., powered down in X1 mode; not powered down in X4 mode).

FIG. 6 shows that in X4 mode each CGB 50 can generate a PCLK signal for use in common by all PCS channels supplying parallel data to the channels 100 of the quad 300 that includes that CGB. As shown in FIG. 6, an LFCLK output signal of CGB 50 frequency divider 60 is applied to one input terminal of multiplexer 330. That same LFCLK signal is also applied to divide-by-2 frequency divider circuitry 320. The output signal of circuitry 320 is applied to the other input terminal of multiplexer 330. Accordingly, multiplexer 330 can select (e.g., programmably) either the LFCLK signal or a signal having half the frequency of the LFCLK signal for application to driver 340 and to one input terminal of multiplexer 350. (As will be seen when FIG. 7 is discussed, the other input to multiplexer 350 is the output of the driver 340 in another quad 300.) The output of multiplexer 350 is the PCLK signal that can be used in common by all four PCS channels that supply parallel data to the four channels 100 of quad 300. (Again, details of the PCS channels will be covered in the later discussion of FIG. 8.) Components 320 and 330 are provided to help support supplying parallel data to channels as either successive 8-bit or 10-bit bytes, or as successive pairs of 8-bit or 10-bit bytes (the bytes in a pair being provided in parallel). The PCLK rate needs to be cut in half (by divider 320) to support the latter option. Components 340 and 350 are provided to help support X8 mode, which will be discussed next.

X8 mode is illustrated in more detail by FIG. 7. This mode employs one CMU to drive eight channels 100. X8 mode is implemented by cascading two quads worth of channels (and hence the CGB_Central units 50 of two CMU macros 10). New circuitry and high-speed path features are employed to "repeat" the clocks from the first quad (the lower, "master" quad 300-0 in FIG. 7) for the second quad (the upper, "slave" quad 300-1 in FIG. 7). The clocks that are used by all eight channels are distributed relatively skew-free to the serializers 140 in all eight channels. All eight channels act as a single synchronous system. Because Local CBGs 110 are not used in this mode, they can be powered-down (i.e., disabled). In this configuration, the master quad (Quad0) generates the serializing clocks, while the slave quad (Quad1) accepts the clocks from the master quad. Clock buffers 310 may be included at the end of Quad0 to drive the serializing clocks to Quad1. Two adjacent quads 300 are able to share the same parallel PCLK. For X8 mode, an additional PCLK_X8 line exists as a distribution path for the two quads. The portion of the PCS (FIG. 8) associated with each quad may tap into this line as shown in FIG. 7.

In particular, the multiplexer 350 in master quad 300-0 is controlled (e.g., programmably) to output (as PCLK) the output signal of the associated multiplexer 330. That PCLK signal is used by the four PCS channels (FIG. 8) associated with quad 300-0. The same multiplexer 330 output signal is passed through the associated buffer 340 in quad 300-0 and applied as the signal PCLK_X8 to the second input terminal of the multiplexer 350 in slave quad 300-1. That multiplexer is controlled (e.g., programmably) to output the PCLK_X8 signal as the PCLK output signal of slave quad 300-1. This PCLK signal is used by the four PCS channels (FIG. 8) associated with quad 300-1. Because this is effectively the same PCLK signal that is being output by master quad 300-0, all eight PCS channels associated with the eight channels 100 of quads 300-0 and 300-1 operate together in a synchronized manner.

Figure 8:
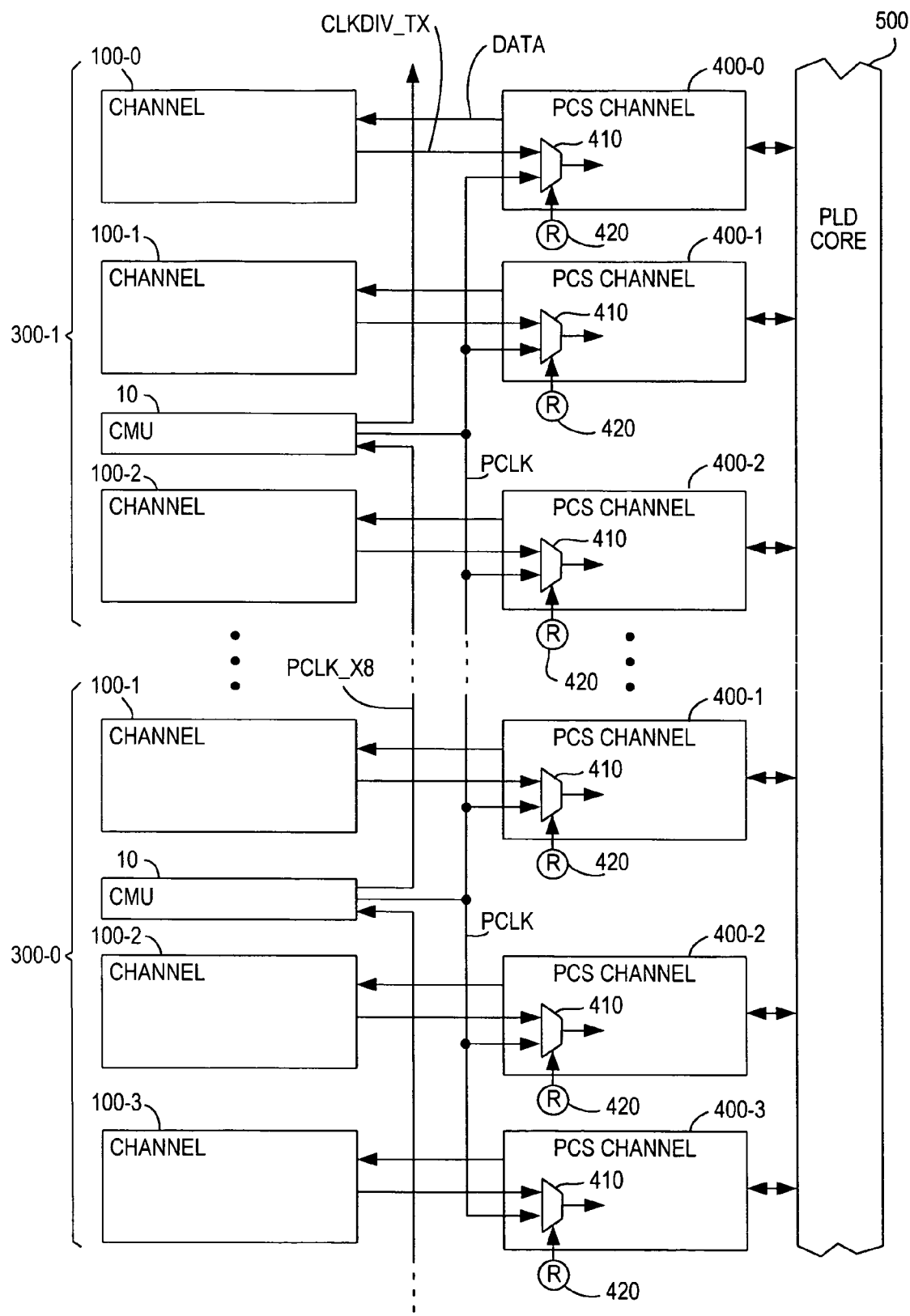
FIG. 8 is a simplified schematic block diagram of an illustrative embodiment of still more circuitry in accordance with the invention.

FIG. 8 shows that each channel 100 has an associated PCS channel 400. PCS channels typically exchange data and control signals (possibly including clock signals) with PLD core circuitry 500. Examples of functions that may be performed by each PCS channel are certain kinds of time-domain buffering of data between PLD core 500 and the associated channel 100, certain kinds of encoding of data from PLD core 500 for passage to the associated channel 100 (e.g., 8-bit/10-bit encoding as in Franaszek et al. U.S. Pat. No. 4,486,739), etc. FIG. 8 shows that each PCS channel 400 receives both the CLKDIV_TX signal output by the associated channel 100 and the PCLK signal output by the CMU 10 of the quad 300 that includes the associated channel 100. These two signals are respectively applied to the two inputs of a multiplexer 410 in each PCS channel 400. Each multiplexer 410 can be controlled (e.g., programmably) to select either of its input signals for use by the PCS channel 400 that includes that multiplexer. For example, the output signal of each multiplexer 410 can be used to control that PCS channel's release of parallel data to the associated channel 100. A channel 100/400 that is operating in X1 mode uses the CLKDIV_TX signal of that channel 100 to control release of parallel data from the associated PCS channel 400 to that channel 100. All channels 100/400 that are operating in X4 mode use the PCLK signal of the CMU 10 of the quad 300 that includes those channels to control release of parallel data from each PCS channel 400 to the associated channel 100. All channels 100/400 that are operating in X8 mode operate as in X4 mode, except that in X8 mode the PCLK output signal of slave quad 300-1 is effectively the same as the PCLK output signal of master quad 300-0. This is as described above in connection with FIG. 7.

FIG. 8 also illustrates the point that multiplexers 410 may be programmably controlled by configuration random access memory ("CRAM") cells 420, if desired. This same type of control can be used for controlling the selections made by any of the other multiplexers shown throughout this specification. CRAM control can also be used to control the parameters used by various controllable components in the circuitry of the invention. For example, the frequency division factors employed by controllable frequency divider circuitry can be controlled by appropriately programming CRAM cells associated with those frequency dividers. CRAM control can also be used to programmably control whether tri-state drivers (e.g., 340 in FIG. 7) are enabled or tri-stated. CRAM control can also be used to programmably control whether selectively powerable circuit components (e.g., CGBs 50 and 110) are powered or not.

It will be understood that the foregoing is only illustrative of the principles of the invention, and that various modifications can be made by those skilled in the art without departing from the scope and spirit of the invention. For example, the numbers of various components that are grouped together in various parts of the circuitry can be different from the numbers shown and described for illustrative purposes herein.

The invention claimed is:

1. Data transmitter circuitry on a PLD comprising:
a plurality of channels of data serializer circuitry, each of which is configured to receive data in parallel and convert that data to serial form for transmission;
a plurality of physical coding sublayer ("PCS") channels, each of which is associated with a respective one of the serializer channels for supplying parallel data to the associated serializer channel when triggered by a clock signal; and
circuitry associated with each of the PCS channels for selecting the clock signal for that PCS channel from a local clock signal and a global clock signal that can be common to as many as eight of the serializer channels.

2. The circuitry defined in claim 1 wherein the local clock signal available to each of the PCS channels is produced by the serializer channel associated with that PCS channel.

3. The circuitry defined in claim 1 further comprising:
circuitry for selecting the global clock signal from a first clock signal that is common to up to four of the serializer channels and a second clock signal that is common to up to eight of the serializer channels.

4. The circuitry defined in claim 1 further comprising:
a plurality of clock multiplier unit ("CMU") circuitries, each of which is associated with a respective subplurality of the serializer channels;
circuitry for supplying a plurality of clock signals from each of the CMUs to the serializer channels associated with that CMU; and
local clock generation and buffering ("CGB") circuitry associated with each of the serializer channels for possible use to produce the local clock signal for the associated PCS channel based on a clock signal from the associated CMU.

5. The circuitry defined in claim 4 wherein each of the CMUs comprises:
central CGB circuitry for possible use to produce the global clock signal.

6. The circuitry defined in claim 5 wherein the circuitry for supplying supplies both clock signals from the CMU that have not been processed by the CGB of the CMU and clock signals from the CMU that have been processed by the CGB of the CMU.

7. The circuitry defined in claim 6 wherein each of the serializer channels comprises:
selection circuitry for selecting for use by that serializer channel either clock signals from a CMU that have not been processed by the CGB of a CMU or clock signals from a CMU that have been processed by the CGB of a CMU.

8. The circuitry defined in claim 7 wherein each serializer channel comprises:
circuitry for applying clock signals from a CMU that have not been processed by the CGB of a CMU to the local CGB circuitry of the serializer channel.

9. Data transmitter circuitry on a PLD comprising:
a plurality of data serializer channels;
a plurality of clock multiplier units ("CMUs") each of which is associated with a respective subplurality of the serializer channels, and each of which produces a raw clock signal and a centrally processed clock signal;
distribution circuitry for distributing the raw clock signal of each CMU to the serializer channels associated with that CMU, and for distributing the centrally processed clock signal of each CMU to the serializer channels associated with that CMU and another of the CMUs;
circuitry associated with each of the serializer channels for selecting any of the clock signals the distribution circuitry distributes to that channel for use by that channel;
a physical coding sublayer ("PCS") channel associated with each of the serializer channels for releasing parallel data to the associated serializer channel in response to a PCLK signal; and
circuitry for selecting the PCLK signal for use by each of the PCS channels from either a clock signal output by the serializer channel associated with that PCS channel or a centrally processed clock signal produced by either of two of the CMUs.

10. Data transmitter circuitry on a PLD comprising:
a plurality of data serializer channels;
a plurality of clock multiplier units ("CMUs"), each of which is associated with a respective subplurality of the serializer channels, and each of which produces a raw clock signal and a centrally processed clock signal;
distribution circuitry for distributing the raw clock signal of each CMU to the serializer channels associated with that CMU, and for distributing the centrally processed clock signal of each CMU to the serializer channels associated with that CMU and another of the CMUs;
a physical coding sublayer ("PCS") channel associated with each of the serializer channels for releasing parallel data to the associated serializer channel in response to a PCLK signal; and
circuitry for selecting the PCLK signal for use by each of the PCS channels from a signal output by the serializer channel associated with that PCS channel or a signal output by any CMU from which a signal is distributed to that serializer channel.

11. The circuitry defined in claim 10 wherein the signal output by each serializer channel is derived from the raw clock signal distributed to that serializer channel.

12. The circuitry defined in claim 10 wherein the signal output each CMU is derived from the centrally processed clock signal of that CMU.

13. The circuitry defined in claim 10 wherein each PCS channel includes:
circuitry for selecting the PCLK signal to be used by that channel from the output signal of the serializer channel associated with that PCS channel and a PCLK output signal of the CMU associated with that serializer channel.

14. The circuitry defined in claim 13 wherein each CMU comprises:
circuitry for selecting the PCLK output signal of that CMU from a signal derived from the centrally processed clock signal of that CMU and the PCLK output signal of another CMU.

15. The circuitry defined in claim 10 wherein each of the serializer channels comprises:

local clock generation and buffering ("CGB") circuitry for processing a raw clock signal distributed to that serializer channel.

16. The circuitry defined in claim 10 wherein each CMU comprises:
   central CGB circuitry for producing the centrally processed clock signal.

17. The circuitry defined in claim 10 wherein each CMU comprises:
   a plurality of reference clock signal sources;
   a plurality of phase-locked loop ("PLL") circuits; and
   circuitry for applying any of the reference clock signals to any of the PLL circuits.

18. The circuitry defined in claim 17 wherein the raw clock signal produced by each CMU is derived from a first one of the PLL circuits of that CMU, and wherein the centrally processed clock signal produced by each CMU is derived from a second one of the PLL circuits of that CMU.

19. The circuitry defined in claim 15 wherein the local CGB circuitry produces both relatively high and relatively low frequency clock signals based on the raw clock signal.

20. The circuitry defined in claim 16 wherein the central CGB circuitry produces a plurality of centrally processed signals, including both relatively high and relatively low frequency signals.

21. The circuitry defined in claim 20 wherein the distribution circuitry distributes the plurality of centrally processed signals of each CMU to the serializer channels associated with that CMU and another of the CMUs.

* * * * *